(12) United States Patent
Hause et al.

(10) Patent No.: US 7,220,655 B1
(45) Date of Patent: May 22, 2007

(54) METHOD OF FORMING AN ALIGNMENT MARK ON A WAFER, AND A WAFER COMPRISING SAME

(75) Inventors: Frederick N. Hause, Austin, TX (US); Jeffrey C. Haines, Austin, TX (US); Michael E. Exterkamp, Pflugerville, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 871 days.

(21) Appl. No.: 10/023,347

(22) Filed: Dec. 17, 2001

(51) Int. Cl.
*H01L 21/00* (2006.01)

(52) U.S. Cl. ............... 438/424; 438/427; 438/405

(58) Field of Classification Search ............ 438/720, 438/633, 638, 639, 669, 692, 723, 975, 737, 438/401, 462, 405, 412, 426, 432, 689, 690, 438/700, 424, 427; 257/797
See application file for complete search history.

(56) References Cited

U.S. PATENT DOCUMENTS

| | | | | |
|---|---|---|---|---|
| 4,724,219 A | * | 2/1988 | Ridinger | 438/535 |
| 5,286,673 A | * | 2/1994 | Nishihara | 438/401 |
| 5,958,800 A | * | 9/1999 | Yu et al. | 438/720 |
| 5,963,816 A | * | 10/1999 | Wang et al. | 438/401 |
| 6,049,137 A | * | 4/2000 | Jang et al. | 257/797 |
| 6,528,386 B1 | * | 3/2003 | Summerfelt et al. | 438/401 |
| 6,706,610 B2 | * | 3/2004 | Yoshimura et al. | 438/401 |
| 7,005,755 B2 | * | 2/2006 | Yoshimura et al. | 257/797 |
| 2004/0135226 A1 | * | 7/2004 | Yoshimura et al. | 257/499 |

FOREIGN PATENT DOCUMENTS

| | | | |
|---|---|---|---|
| JP | 2000156506 A | * | 6/2000 |
| WO | PCT/JP00/01435 A | * | 9/2001 |
| WO | WO 200167509 A | * | 9/2001 |

* cited by examiner

*Primary Examiner*—Laura M. Schillinger
(74) *Attorney, Agent, or Firm*—Williams, Morgan & Amerson, P.C.

(57) ABSTRACT

Disclosed herein is a method comprised of providing a wafer comprised of a bulk substrate, an insulating layer positioned above the bulk substrate, and a semiconducting layer positioned above the insulating layer, forming an opening in the semiconducting layer and the insulating layer to thereby expose a surface area of the bulk substrate, forming an alignment mark in the bulk substrate within the exposed surface area of the bulk substrate, and forming a layer of material above the alignment mark and in the opening. A wafer is also disclosed herein that is comprised of a bulk substrate, an insulating layer positioned above the bulk substrate, a semiconducting layer positioned above the insulating layer, an opening formed in the semiconducting layer and the insulating layer, an alignment mark formed in the bulk substrate within an area defined by the opening, and a layer of material positioned above the alignment mark and within the opening.

14 Claims, 3 Drawing Sheets

METHOD OF FORMING AN ALIGNMENT MARK ON A WAFER, AND A WAFER COMPRISING SAME

BACKGROUND OF THE INVENTION

1. Field of the Invention

This invention relates generally to semiconductor fabrication technology, and, more particularly, to a method of forming an alignment mark on a wafer, and a wafer comprising same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

Conventional complementary metal oxide silicon (CMOS) semiconductor devices may be referred to as "bulk" CMOS devices, because bulk CMOS devices include a substantially monocrystalline semiconducting bulk substrate in which the active and/or passive CMOS circuit elements are disposed. More recently, silicon-on-insulator (SOI) devices have been introduced that consume less power than do bulk CMOS devices, an important advantage in many applications such as battery-powered mobile telephones and battery-powered laptop computers. Also, silicon-on-insulator (SOI) devices advantageously operate at higher speeds than do bulk CMOS devices.

Silicon-on-insulator (SOI) devices may be characterized by having a thin layer of insulating dielectric material (for example, a buried oxide or nitride or other suitable insulating layer) sandwiched between a bulk semiconducting substrate and a relatively thin semiconducting layer in which the circuit elements of the device will be formed. Typically, no other layers of material are interposed between the buried dielectric layer and the bulk substrate.

In a silicon-on-insulator (SOI) device, the circuit elements of the device are formed in regions of the relatively thin, e.g., 500-1500 Å, semiconducting layer. The circuit elements are typically separated from each other by insulating dielectric regions (of field oxide, for example). The semiconducting layer may be n-doped or p-doped as appropriate with N-type or P-type conductivity dopants. A variety of semiconductor devices may be formed in the thin semiconducting layer. For example, devices such as NMOS transistors, PMOS transistors, NPN bipolar transistors, and/or PNP bipolar transistors may be formed in the thin semiconducting layer.

Silicon-on-insulator (SOI) technology offers a number of advantages relative to traditional transistor formation in a bulk silicon wafer. For example, bulk silicon transistors have their active terminals disposed adjacent the bulk silicon wafer. As a result, parasitic capacitance is present at the junction between the source/drain regions of an MOS transistor and the well or bulk silicon substrate. Other problems with bulk silicon transistors include the possibility of junction breakdown between the source/drain regions and the wafer, together with the formation of undesired parasitic bipolar transistors giving rise to device latch-up problems.

In contrast, in silicon-on-insulator (SOI) technology, the transistors have active regions (for example, the source/drain and channel regions of an MOS transistor) that are formed in the thin semiconducting layer that is positioned above the underlying insulating layer. As such, formation of undesired parasitic elements in such transistors is reduced or eliminated. The silicon-on-insulator (SOI) technology also significantly reduces junction capacitance and junction leakage due to the reduced exposed junction area. This reduced parasitic capacitance leads to increased performance and higher density integrated circuits. Also, transistors formed using silicon-on-insulator technology exhibit inherent radiation hardness, better high temperature performance, higher current driving ability, and lower leakage currents.

Additionally, in some cases, silicon-on-insulator (SOI) techniques use simpler fabrication sequences as compared to circuits fabricated in bulk silicon. Silicon-on-insulator (SOI) techniques also provide reduced capacitive coupling between various circuit elements over the entire integrated circuit (IC) chip, and, in CMOS circuits, latchup is substantially reduced. Silicon-on-insulator (SOI) techniques reduce chip size and/or increase packing density, and minimum device separation is determined only by the limitations of photolithography. Moreover, silicon-on-insulator (SOI) techniques provide increased circuit speed, due in part to reductions in parasitic capacitance and chip size.

During semiconductor manufacturing processes, layers of various materials are deposited and/or spun-on and/or grown on a workpiece, such as a semiconducting wafer or die, one after the other. After many of the layers are deposited and/or spun-on and/or grown, photolithographic and etching process techniques are used to transfer patterns to the underlying layer or layers. For the finished product to operate properly, the pattern of each layer should be precisely aligned to the patterns of the other layers on the workpiece, since misalignment of one layer with respect to a previous layer may adversely impact device performance or, in some cases, result in complete device failure. One photolithographic system commonly used is a step-and-scan pattern transfer system (using a "scanner" such as the ASM® Lithography scanner) that involves repetitively transferring a series of image patterns, often with multiple exposures for each portion of a workpiece, to cover the entire workpiece surface.

To achieve acceptable alignment, alignment marks may be formed on the workpiece. The number of alignment marks employed per wafer may vary, e.g., 2-8 per wafer. The previously formed alignment marks may then be used by the stepper tool to properly align the wafer prior to performing photolithography processes on the wafer.

In some embodiments, the alignment marks are typically a pattern of trenches formed by an etching process. The alignment marks desirably have relatively sharp edges, and depths that allows the alignment marks to be recognized by the stepper to make the alignment mark useful as an alignment tool. A typical depth of the alignment mark required by conventional steppers manufactured by ASM® Lithography is in a range of about 1000-2100 Å, although as technology continues to advance, this depth may decrease. Alignment marks used by steppers of other stepper manufacturers may need a different mark depth.

In silicon-on-insulator devices, the alignment marks are formed in the relatively thin semiconducting layer positioned above the insulating layer. However, as device dimensions continue to shrink, locating the alignment marks in the relatively thin semiconducting layer may be problematic for a variety of reasons. For example, as the thickness of the thin semi-conducting layer is reduced, there may be insufficient material to allow formation of the alignment marks in that layer. Additionally, since the layer in which the alignment marks are formed is very thin, the marks may not be as stable as would otherwise be desired. That is, even small movements in the thin semiconducting layer due to, for example, thermal variations, may introduce errors in patterning operations that are aligned by referencing alignment marks formed in such a thin layer. Moreover, during normal processing operations, the upper surface of the semiconducting layer may be exposed to processes that degrade or erode the surface of that layer. For example, the surface of the thin semiconducting layer may be subjected to a variety of heating operations that may tend to convert part of the semiconducting layer to silicon dioxide, thereby consuming part of the semiconducting layer. Additionally, the surface of the semiconducting layer may also be subjected to various cleaning operations during the course of manufacturing, e.g., a dilute acid rinse to remove unwanted native oxide. All of the processes tend to degrade the alignment mark formed in the semiconducting layer. In some cases, the degradation may adversely impact the ability to use the alignment mark in various alignment procedures.

The present invention is directed to overcoming, or at least reducing the effects of, one or more of the problems set forth above.

SUMMARY OF THE INVENTION

In general, the present invention is directed to a method of forming alignment marks on a wafer. In one illustrative embodiment, the method disclosed herein comprises providing a wafer comprised of a bulk substrate, an insulating layer positioned above the bulk substrate, and a semiconducting layer positioned above the insulating layer, and forming an opening in the semiconducting layer and the insulating layer to thereby expose a surface area of the bulk substrate. The method further comprises forming an alignment mark in the bulk substrate within the exposed surface area of the bulk substrate, and forming a layer of material above the alignment mark and in the opening.

The present invention is also directed to a wafer comprised of a bulk substrate, an insulating layer positioned above the bulk substrate, a semiconducting layer positioned above the insulating layer, an opening formed in the semiconducting layer and the insulating layer, an alignment mark formed in the bulk substrate within an area defined by the opening, and a layer of material positioned above the alignment mark and within the opening. Of course, a wafer formed in accordance with the present methodologies may have many such alignment marks formed across the wafer. For example, 2-8 such alignment marks may be formed at various locations across the wafer.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
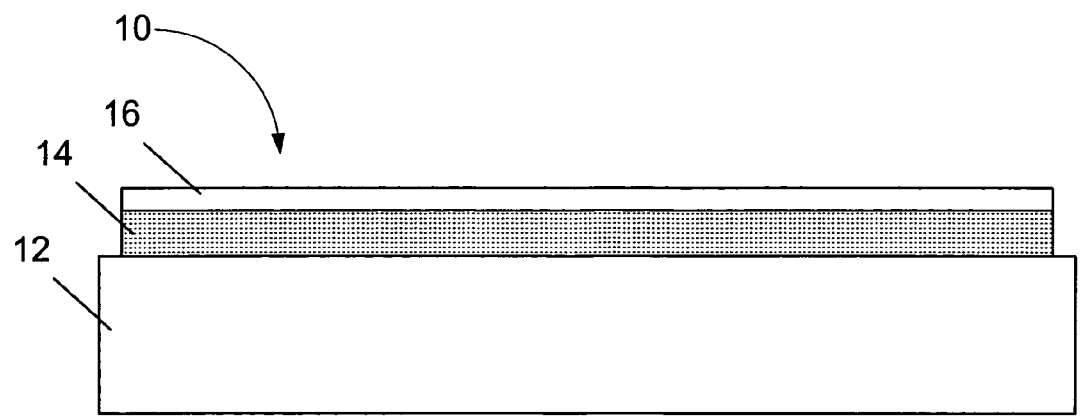
FIGS. 1-7 are various views depicting one illustrative embodiment of the procedures and devices disclosed herein.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and structures depicted in the drawings may be exaggerated or reduced as compared to the size of those features or structures on real-word systems. Nevertheless, the attached drawings are included to describe and explain illustrative examples of the present invention.

In general, the present invention is directed towards the formation of alignment marks on a wafer, and a wafer comprising such alignment marks. As will be readily apparent to those skilled in the art upon a complete reading of the present application, the present method is applicable to a variety of technologies, for example, NMOS, PMOS, CMOS, and the like, and is readily applicable to a variety of devices, including, but not limited to, logic devices, memory devices, and the like. Moreover, the present invention may be employed in the context of forming integrated circuit devices from a variety of semiconductor materials, e.g., silicon, III-V materials, etc.

The present invention will now be described with reference to the attached figures. FIG. 1 depicts a wafer 10 comprised of a bulk substrate 12, an insulating layer 14 and a semiconducting layer 16. As will be recognized by those skilled in the art after a complete reading of the present invention, semiconductor devices, e.g., transistors, etc., will be formed in the semiconducting layer 16 using known fabrication techniques. As will be described more fully below, the materials comprising the layers, as well as their respective thicknesses, may vary greatly. Thus, the particular details of construction discussed herein, including materials and thicknesses, should not be considered a limitation of the present invention unless such limitations are expressly recited in the appended claims. The wafer 10 may be of any size and configuration. For example, the wafer 10 may be generally circular in nature and it may have a diameter of approximately 4 inches, 8 inches, 12 inches, etc. The views of the wafer 10 in the attached drawings depict only portions of the wafer 10 where an alignment mark 30 (see FIG. 4) will be formed. The wafer 10 depicted in FIG. 1 may be formed by a variety of techniques, e.g., by various known bonding techniques. Thus, the particular manner in which the wafer 10 is formed should not be considered a limitation of the present invention unless such limitations are expressly set forth in the appended claims.

The bulk substrate 12 may be comprised of a variety of materials, such as silicon, silicon nitride, gallium arsenide, silicon germanium, silicon-on-sapphire (SOS) or other semiconducting or non-semiconducting materials. Similarly, the insulating layer 14 may be comprised of a variety of materials, such as silicon dioxide, silicon oxynitride, silicon nitride, or any other material having a dielectric constant less than approximately 8. The thickness of the insulating layer 14 may also vary a great deal. For example, in some embodiments, the insulating layer 14 may have a thickness ranging from approximately 1000-2500 Å. The semiconducting layer 16 may also be comprised of a variety of materials, such as silicon, gallium arsenide, silicon germanium, etc. The thickness of the semiconducting layer 16 may also vary, e.g., from approximately 500-1500 Å, and further reductions in thickness of the semiconducting layer 16 may occur as technologies continue to evolve.

In one particularly illustrative embodiment, the bulk substrate 12 is comprised of silicon, the insulating layer 14 is comprised of silicon dioxide having a thickness of approximately 2000 Å, and the semiconducting layer 16 is comprised of an epitaxial silicon having a thickness ranging from approximately 500-1200 Å. Such a combination is sometimes referred to as a silicon-on-insulator (SOI) structure. However, the present invention should be not be considered as limited to such SOI structures unless such limitations are expressly recited in the appended claims. Moreover, it should be understood that the bulk substrate 12 and the semiconducting layer 16 need not be made of the same material. Thus, the composition of the bulk substrate 12 and the semiconducting layer 16 should not be considered as limited to any particular materials unless such limitations are clearly set forth in the appended claims.

Figure 2:
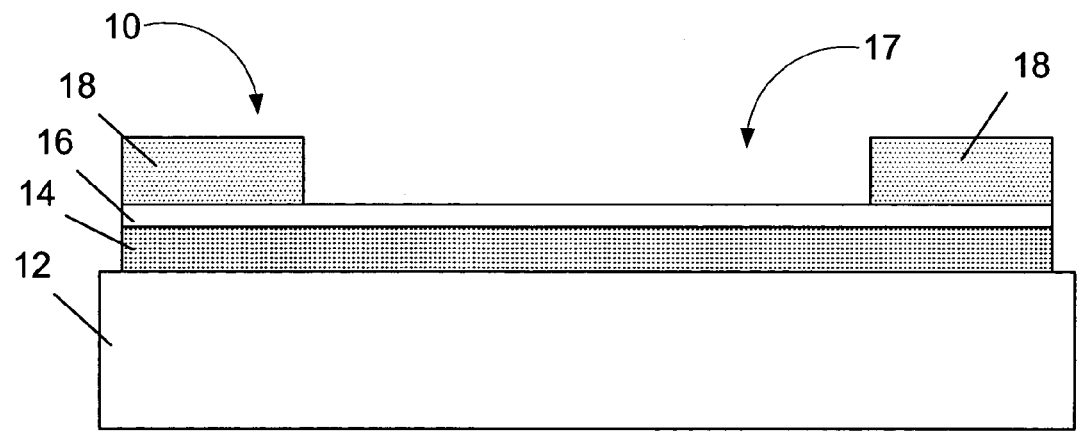

As shown in FIG. 2, a patterned layer of photoresist 18 is formed above the semiconducting layer 16 using traditional photolithography techniques and equipment. An opening 17 is defined in the patterned layer of photoresist 18. The patterned layer of photo-resist 18 will be used as a mask in subsequent etching operations to be described more fully below.

Figure 3:
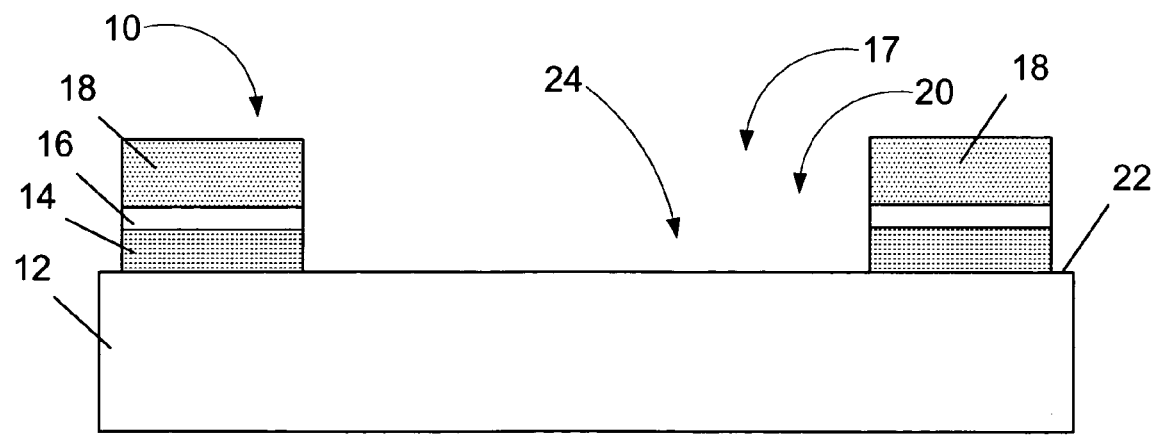

As shown in FIG. 3, one or more etching processes are performed to define an opening 20 in the semiconducting layer 16 and the insulating layer 14. The opening 20 defines an exposed area 24 of the bulk substrate 12 wherein the surface 22 of the bulk substrate 12 is exposed for further processing. The size and configuration of the opening 20 may vary as a matter of design choice. As described more fully below, an alignment mark 30 (see FIG. 4) may be formed in the bulk substrate 12 in the exposed area 24 of the bulk substrate 12 within the opening 20. For example, the opening 20 may have dimensions of approximately 100 microns by 100 microns, e.g., an area of approximately 10,000 square microns. The opening 24 may be of any shape, e.g., rectangular, square, circular, etc. The opening 20 may be formed by performing a single etch process or it may be formed by performing two separate etch processes. Moreover, the opening 20 may be formed in a single etch tool or in multiple etch tools. Thus, the particular techniques used in forming the opening 20 in the semiconducting layer 16 and the insulating layer 14 should not be considered a limitation of the present invention unless such limitations are expressly set forth in the appended claims.

Figure 4:
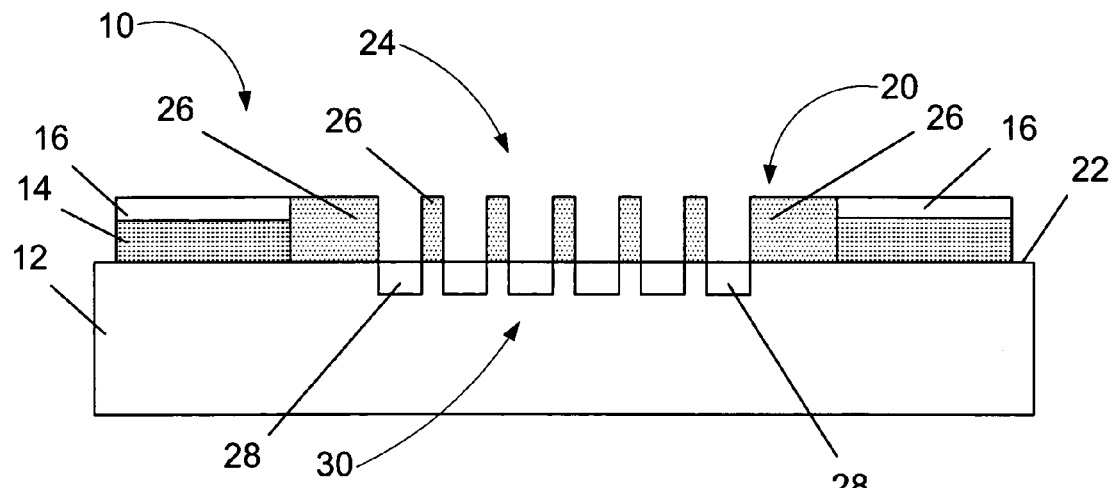
Figure 5:
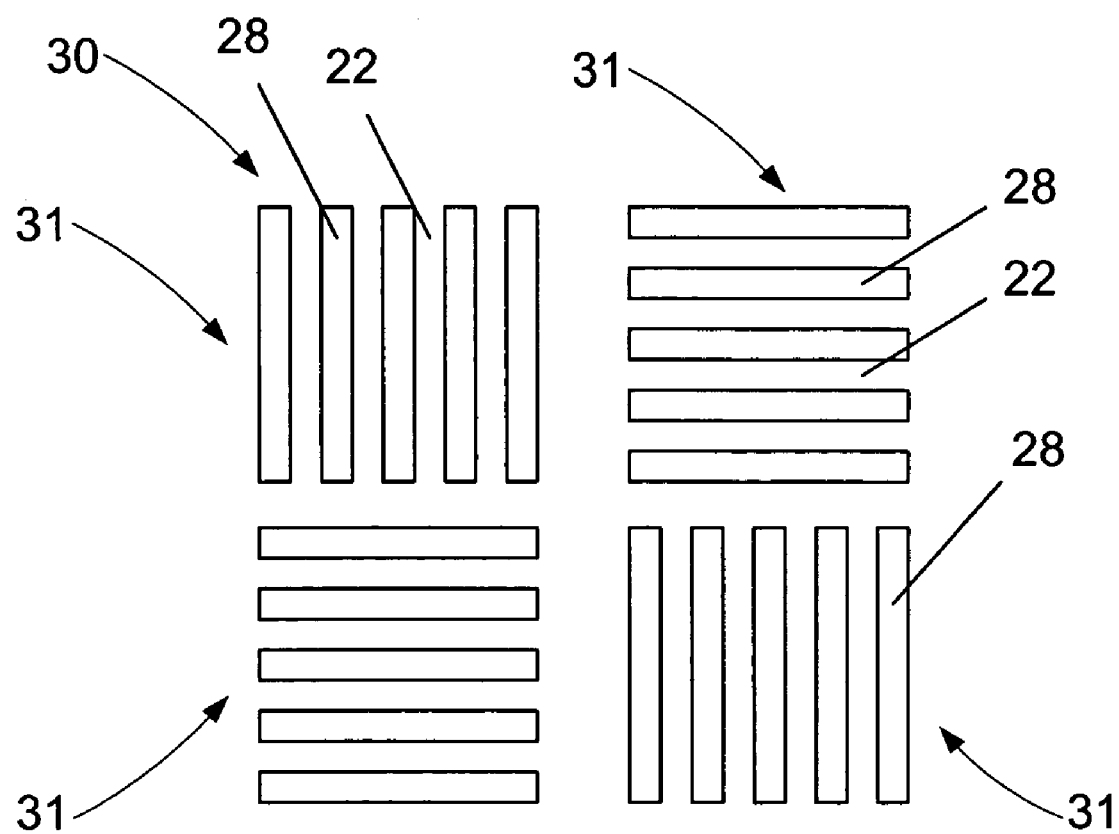

Next, as shown in FIG. 4, the patterned layer of photoresist 18 has been removed and a patterned layer of photoresist 26 is formed within the opening 20. The patterned layer of photoresist 26 may be formed using traditional photolithography techniques and equipment. The patterned layer of photoresist 26 will be used as a mask in subsequent formation of the alignment mark 30 in the bulk substrate 12. After formation of the patterned photoresist layer 26, one or more etching processes are performed to define the alignment mark 30 in the bulk substrate 12 within the exposed area 24 defined by the opening 20. In the depicted embodiment in FIG. 4, the alignment marks 30 are comprised of a plurality of trenches 28 etched into the bulk substrate 12. However, as will be understood by those skilled in the art after a complete reading of the present invention, the alignment mark 30 may be of any type, shape or configuration that may be useful in performing the alignment function in photolithography operations or other operations where alignment may be an important issue. For example, as shown in FIG. 5, the alignment mark 30 may be comprised of a plurality of grating structures 31. Thus, the present invention should not be considered as limited to any particular shape or configuration of the alignment mark 30 unless such limitations are specifically recited in the appended claims.

Figure 6:
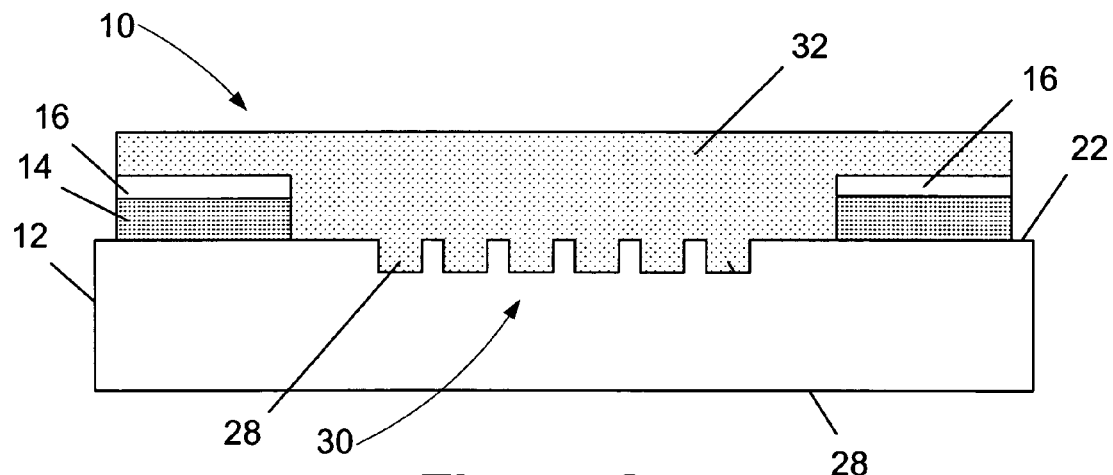
Figure 7:
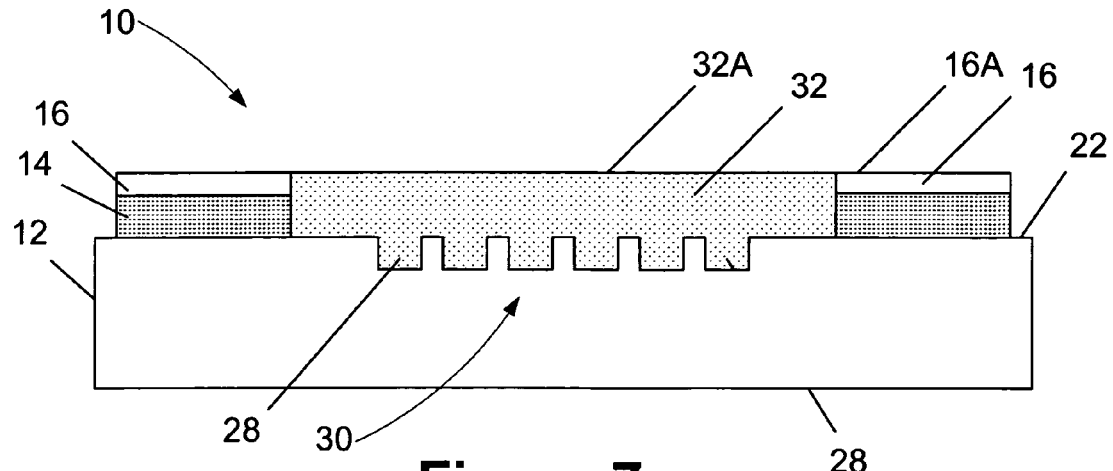

The next process involves removal of the patterned layer of photoresist 26 by, for example, an ashing process or a dilute acid rinse. Thereafter, as shown in FIG. 6, a layer of material 32 may be formed in the opening 20 and above the alignment mark 30 formed in the bulk substrate 12. The layer 32 may be comprised of a variety of insulating and/or non-insulating materials. In one embodiment, the layer 32 may be comprised of silicon dioxide, silicon oxynitride, silicon nitride, or any other material having a dielectric constant less than approximately 8. Moreover, the layer of material 32 may be formed as a separate process step to cover the alignment mark 30, or it may be formed as part of another process, e.g., a silicon dioxide fill of previously formed shallow trench isolation regions (not shown) in the semiconducting layer 16. Thereafter, if desired, a planarization operation, e.g., a chemical mechanical polishing process, may be performed such that the surface 32A of the layer of material 32 is approximately planar with the surface 16A of the semiconducting layer 16. See FIG. 7.

In general, the present invention is directed to a method of forming alignment marks on a wafer. In one illustrative embodiment, the method disclosed herein comprises providing a wafer 10 comprised of a bulk substrate 12, an insulating layer 14 positioned above the bulk substrate 12, and a semiconducting layer 16 positioned above the insulating layer 14, and forming an opening 20 in the semiconducting layer 16 and the insulating layer 14 to thereby expose a surface area 24 of the bulk substrate 12. The method further comprises forming an alignment mark 30 in the bulk substrate 12 within the exposed surface area 24 of the bulk substrate 12, and forming a layer of material 32 above the alignment mark 30 and in the opening 20.

The present invention is also directed to a wafer comprised of a bulk substrate 12, an insulating layer 14 positioned above the bulk substrate 12, a semiconducting layer 16 positioned above the insulating layer 14, an opening 20 formed in the semiconducting layer 16 and the insulating layer 14, an alignment mark 30 formed in the bulk substrate 12 within an area defined by the opening 20, and a layer of material 32 positioned above the alignment mark 30 and within the opening 20. Of course, a wafer 10 formed in accordance with the present methodologies may have many such alignment marks 30 formed across the wafer 10. For example, 2-8 such alignment marks 30 may be formed at various locations across the wafer 10.

As will be recognized by those skilled in the art after a complete reading of the present application, the alignment mark 30 formed in accordance with the presently disclosed techniques offers several advantages. First, the alignment mark 30 is not repeatedly exposed to processing operations since it is formed in the bulk substrate 12 and protected by the layer 32 formed thereabove. Thus, the integrity of the alignment mark may be maintained throughout the processing life of the wafer 10. Even though the alignment mark 30 is covered by the layer 32 (and perhaps other material layers), the photolithography equipment can still sense the location of the alignment mark 30 and use it to properly align the photo-lithography procedures. Second, the alignment mark 30 is formed in the much thicker bulk substrate 12, thereby increasing its stability. Through use of the present invention, it is believed that alignment procedures used in semiconductor manufacturing operations may be performed more accurately and reliably. As a result, manufacturing efficiencies and product yields may also increase.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method comprising:
providing a wafer comprised of a bulk substrate, an insulating layer positioned above said bulk substrate, and a semiconducting layer positioned above said insulating layer;
forming an opening in said semiconducting layer and said insulating layer to thereby expose a surface area of said bulk substrate;
forming a patterned layer of photoresist above said exposed surface area of said bulk substrate;
performing at least one etching process to form an alignment mark in said bulk substrate within said exposed surface area of said bulk substrate using said patterned layer of photoresist as a mask for said at least one etching process; and
forming a layer of material above said alignment mark and in said opening.

2. The method of claim 1, wherein providing a wafer comprised of a bulk substrate, an insulating layer positioned above said bulk substrate, and a semiconducting layer positioned above said insulating layer comprises providing a wafer comprised of a bulk substrate comprised of at least one of silicon, silicon nitride, gallium arsenide, and silicon germanium.

3. The method of claim 1, wherein providing a wafer comprises providing a wafer having a diameter of at least one of approximately 4 inches, 8 inches and 12 inches.

4. The method of claim 1, wherein forming an opening in said semiconducting layer and said insulating layer to thereby expose a surface area of said bulk substrate comprises performing at least one etching process to form an opening in said semiconducting layer and said insulating layer to thereby expose a surface area of said bulk substrate.

5. The method of claim 1, wherein forming a layer of material above said alignment mark and in said opening comprises depositing a layer of material above said alignment mark and in said opening.

6. The method of claim 1, wherein forming a layer of material above said alignment mark and in said opening comprises forming a layer of material comprised of at least one of silicon dioxide, silicon oxynitride, silicon nitride and a material having a dielectric constant less than approximately 8.0 above said alignment mark and in said opening.

7. The method of claim 1, further comprising performing a planarization operation after forming said material above said alignment mark and in said opening.

8. The method of claim 1, further comprising:
positioning said wafer in a photolithography stepper tool; and
reflecting a light off of said alignment mark formed in said bulk substrate to properly position said wafer for processing in said photolithography stepper tool.

9. The method of claim 1, wherein forming an opening in said semiconducting layer and said insulating layer to thereby expose a surface area of said bulk substrate comprises forming a plurality of openings in said semiconducting layer and said insulating layer to thereby expose a surface area of said bulk substrate within each of said openings.

10. The method of claim 9, wherein forming an alignment mark in said bulk substrate within said exposed surface area of said bulk substrate comprises forming an alignment mark in said bulk substrate within said exposed surface area of said bulk substrate in each of said openings.

11. The method of claim 1, wherein forming an alignment mark in said bulk substrate within said exposed surface area of said bulk substrate comprises forming an alignment mark comprised of a plurality of grating structures in said bulk substrate within said exposed surface area of said bulk substrate.

12. The method of claim 1, wherein providing the wafer comprised of the bulk substrate, the insulating layer positioned above said bulk substrate, and the semiconducting layer positioned above said insulating layer comprises providing a semiconducting layer comprised of silicon positioned above said insulating layer.

13. The method of claim 1, wherein providing the wafer comprised of the bulk substrate, the insulating layer positioned above said bulk substrate, and the semiconducting layer positioned above said insulating layer comprises providing a semiconducting layer comprised of gallium arsenide positioned above said insulating layer.

14. The method of claim 1, wherein providing the wafer comprised of the bulk substrate, the insulating layer positioned above said bulk substrate, and the semiconducting layer positioned above said insulating layer comprises providing a semiconducting layer comprised of silicon germanium positioned above said insulating layer.

* * * * *